(12) United States Patent
Chong et al.

(10) Patent No.: US 6,438,361 B1
(45) Date of Patent: Aug. 20, 2002

(54) APPARATUS AND METHOD FOR AUTOMATIC SELECTION OF BROADBAND FREQUENCY CHANNEL USING DOUBLE FREQUENCY CONVERSION

(75) Inventors: Young Jun Chong, Taejon; Jae Young Kim, Pucheon-shi; Sung Choon Kang, Taejon; Jae Ick Choi, Taejon; Jae Hong Park, Taejon, all of (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/474,090

(22) Filed: Dec. 29, 1999

(30) Foreign Application Priority Data

Nov. 11, 1999 (KR) .......................... 99-49890

(51) Int. Cl.[7] ............................... H04Q 7/32
(52) U.S. Cl. ................. 455/188.1; 455/192; 348/731
(58) Field of Search ................. 455/180.1, 188.1, 455/188.2, 314, 315, 316, 183.1, 192.1, 193.1, 193.2, 182.3, 180.3, 190.1, 313, 189.1; 348/731, 732, 733, 469, 470, 735

(56) References Cited

U.S. PATENT DOCUMENTS

| | | | |
|---|---|---|---|
| 4,322,856 A | | 3/1982 | Ohta et al. ................. 455/189 |
| 4,334,323 A | | 6/1982 | Moore ........................ 455/179 |
| 4,402,089 A | * | 8/1983 | Knight et al. ............. 455/186.1 |
| 4,408,348 A | | 10/1983 | Theriault ................... 455/180 |
| 4,419,768 A | | 12/1983 | Yamashita et al. ......... 455/180 |
| 4,476,583 A | * | 10/1984 | Muterspaugh ........... 455/180.3 |
| 4,507,680 A | * | 3/1985 | Freeman ..................... 348/484 |
| 5,200,826 A | * | 4/1993 | Seong ........................ 348/731 |
| 5,382,921 A | * | 1/1995 | Estrada et al. ............. 327/159 |
| 5,999,802 A | * | 12/1999 | Aschwanden ............ 455/196.1 |
| 6,016,170 A | * | 1/2000 | Takayama et al. ......... 348/731 |
| 6,201,564 B1 | * | 3/2001 | Limberg ...................... 348/21 |
| 6,313,885 B1 | * | 11/2001 | Patel et al. ................. 348/614 |

OTHER PUBLICATIONS

Bao, et al.; *An ATV Receiver Tuner*; Mar. 1996; pp. 152–153.
Davidson, et al; *Front–end of a Digital ATV Receiver*; pp. 294–295.
Chong, et al.; *1998 IEEE MTT–S International Microwave Symposium Digest—The Implementation of RTU and RSU Transceiver for WLL System*; May 1998; pp. 193–196.
Bretl, et al.; *VSB Modem Subsystem Design for Grand Alliance Digital Television Receivers*; Jun. 12, 1995; pp. 773–786.
Wassener; *A Small Package Integrated Two Band Mixer–Oscillator SI–IC*; Jun. 11, 1993; pp. 344–349.

* cited by examiner

Primary Examiner—Nay Maung
Assistant Examiner—Jean A Gelin
(74) Attorney, Agent, or Firm—Jacobson Holman, PLLC (57) ABSTRACT

An apparatus, method and readable medium capable of automatically selecting a channel of a broadband frequency and calibrating a frequency change using approximated frequency mapping function are disclosed. The apparatus comprises a frequency band dividing part; a frequency converting part; a first controlling part; and a second controlling part. The second controlling part selects a coefficient of an approximated frequency mapping function for a channel corresponding to a channel conversion selection signal from outside from previously stored coefficients of approximated frequency mapping function for the divided frequency.

13 Claims, 9 Drawing Sheets

APPARATUS AND METHOD FOR AUTOMATIC SELECTION OF BROADBAND FREQUENCY CHANNEL USING DOUBLE FREQUENCY CONVERSION

BACKGROUND OF THE INVENTION

The present invention relates to an apparatus and method for automatically selecting a broadband frequency, more particularly, to an apparatus, method and readable medium capable of automatically selecting a channel of a broadband frequency using approximated frequency mapping function.

A common TV set has to select a desired TV channel automatically and suppress signals that may induce falling of TV quality or difficulties in watching of TV broadcasting. These signals are an interference signal, an image signal, Intermediate Frequency Beat (hereafter, it is called as "IF Beat"), and a spurious signal and affect to a TV set like followings.

First, watching of TV broadcasting is impossible by saturation of a low noise amplifier and a mixer at the front end of a tuner due to a large interference signal of adjacent band.

Second, receiving sensitivity of TV is getting worse due to the existence of mutual modulation component by two or more large interference signal of adjacent band in band passed by the TV channel being watched.

Third, receiving sensitivity of TV is decreased by influx of the signal corresponding to an image signal and IF beat component of a receiver or by converting its frequency into an intermediate frequency generated at the receiver comprising a desired TV information.

Several methods are proposed to solve the problems.

Figure 1:
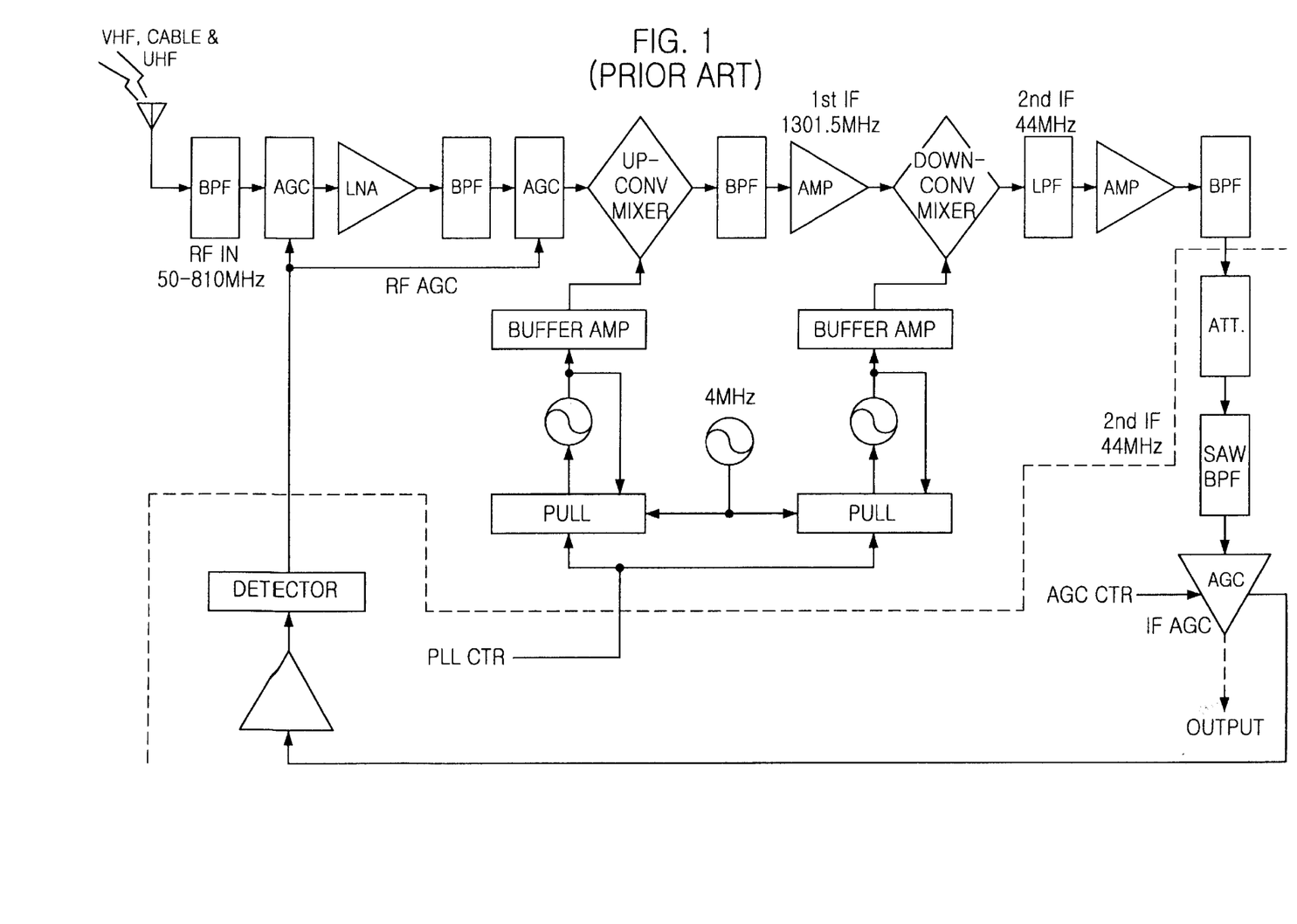
FIG. 1 is a block diagram of a prior tuner using conversion of a double frequency.

FIG. 1 is a block diagram of a tuner for conventional double frequency conversion. The conventional tuner can automatically select TV channel frequency on a receiving route and suppress an image signal, IF Beat, a spurious component by local power without an additional circuit.

However, the tuner has problems when it receives the broadcasting signal from multi-channel simultaneously. Particularly, since the tuner cannot suppress a strong undesired broadcasting interference signal, an operation region of receiver becomes small, and at the worst, a low noise amplifier and a mixer may enter upon a saturation state of a power.

Figure 2:
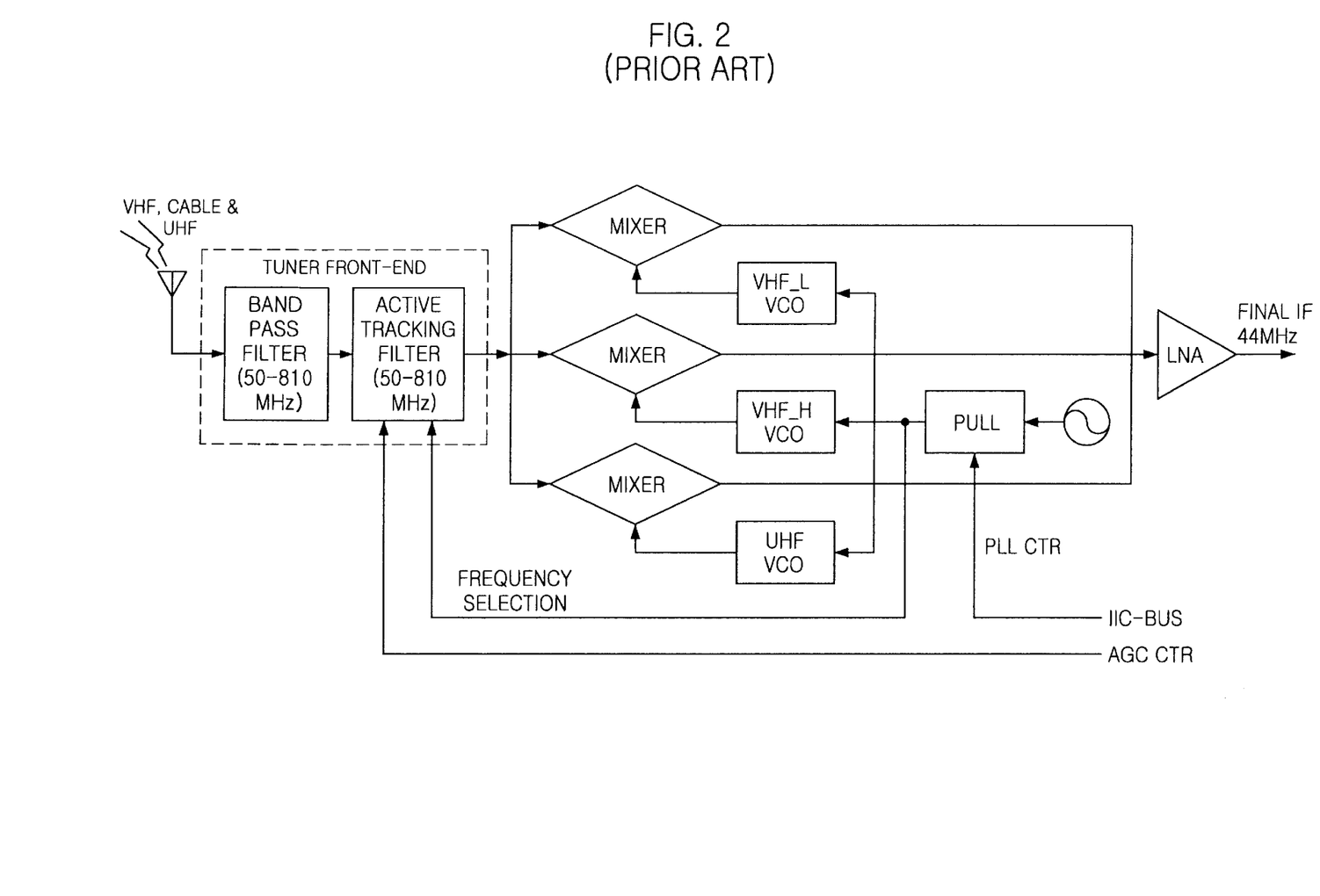
FIG. 2 is a block diagram of a prior NTSC TV tuner.

FIG. 2 is a block diagram of a prior NTSC TV tuner. The tuner of FIG. 2 is a present common analogue broadcasting tuner (it use 3 bands) and, as the tuner of FIG. 2, can automatically select a TV channel.

The tuner of FIG. 2 uses a tracking filter instead of a bandpass filter at front end of a receiver. Thus, it can suppress a strong broadcasting interference signal (the signal has a VHF band of 10 MHz or more and an UHF band of 30 MHz or more) and has a broad operation region of a receiver. However, the performance of the receiver is getting worse, because of existence of an image signal and IF Beat component in a band of a desired IF signal by one frequency conversion in receiving multi-channel broadcasting signal.

Nowadays, a common NTSC (National Television Systems Committee) tuner and TV tuner for the digital terrestrial broadcasting (hereafter it is called as "DTV tuner") under developing have to receive a broadcasting input frequency of 50–810 MHz and accommodate all of 181 channels comprising cable TV channels as well as broadcasting channels (CH2–CH69). Also, the tuner must be able to tune a channel frequency automatically with at least interface (for example, automatic gain controller and IIC-Bus terminal). The NTSC is one of methods for color television transmitting used in USA, Korea, Japan, etc.

The NTSC tuner generates a desired signal by one frequency conversion, while the DTV tuner uses double frequency conversion to minimize effect of an image signal and IF Beat.

However, as these tuners divides a broadcasting frequency band into three bands (VHF_L, VHF-h & UHF) or two bands (VHF & UHF) by using a tracking filter at the front end of tuner, it can improve various characteristics(for example, intermodulation, crossmodulation, linearity) invoked by linearity extension of a receiver and out-of-band interference signal.

Figure 3:
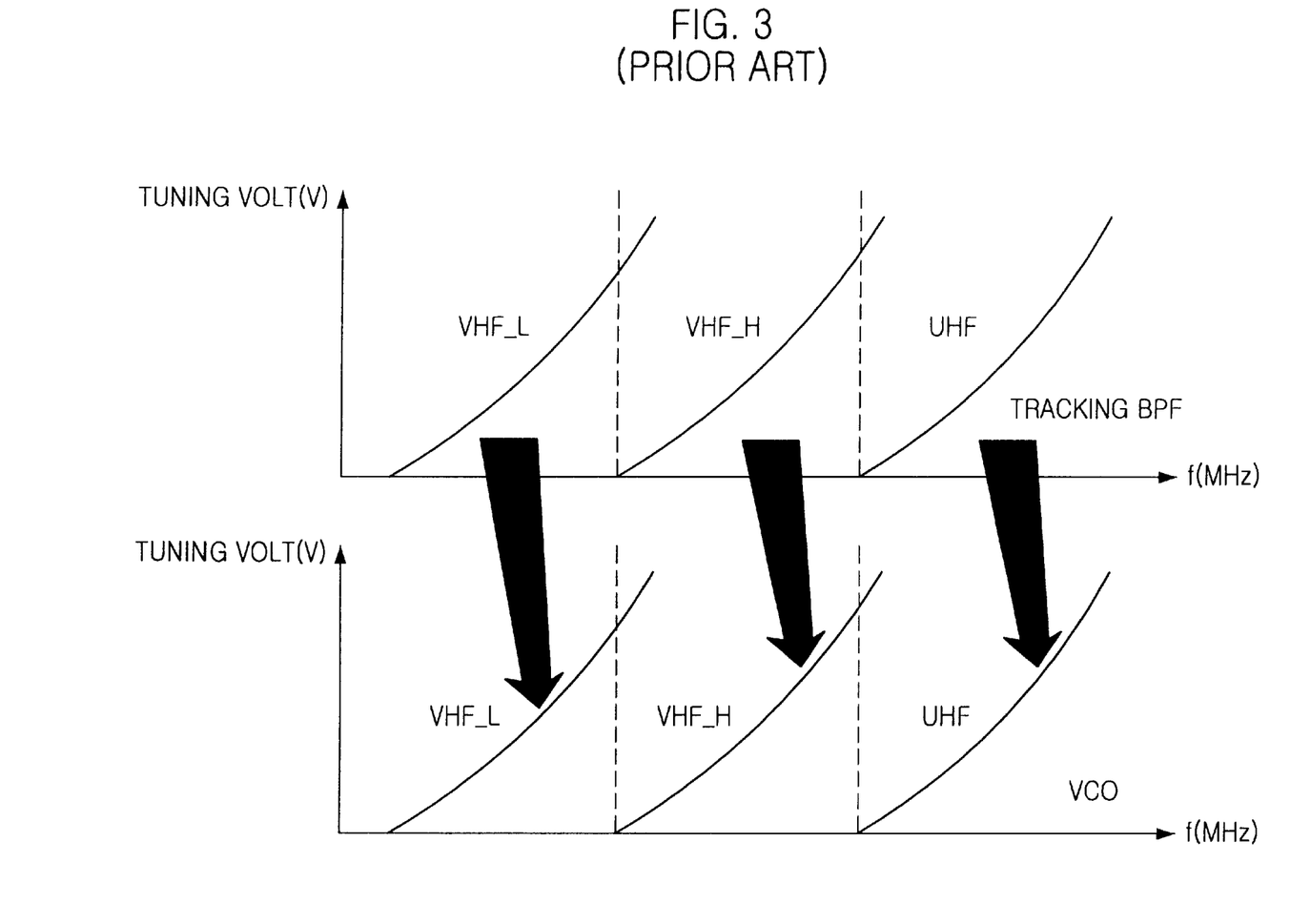
FIG. 3 is a diagram showing a frequency mapping of a prior NTSC TV tuner.
Figure 4:
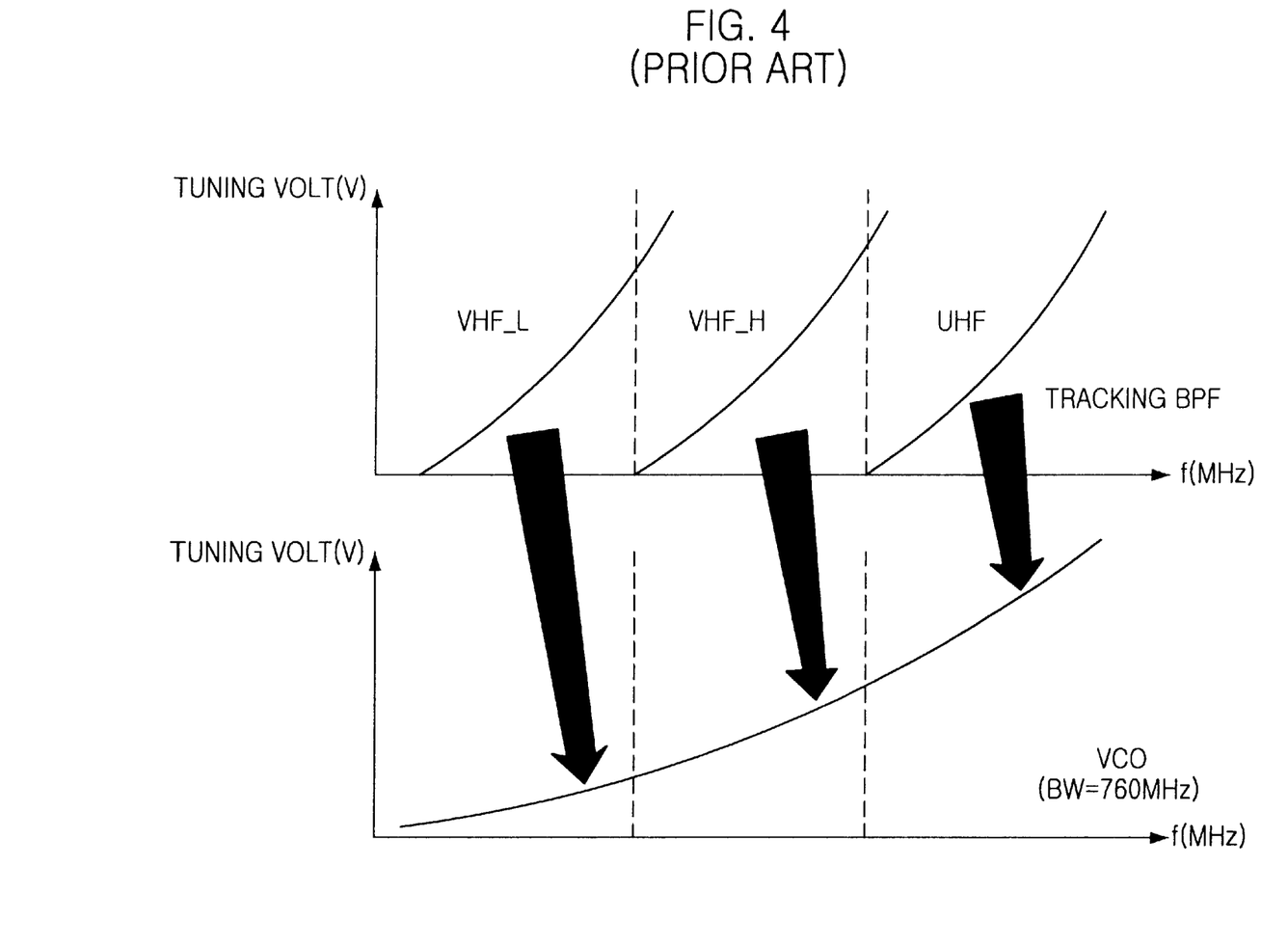
FIG. 4 is a diagram showing a frequency mapping of a prior DTV having a tracking filter.

FIG. 3 is a diagram showing a frequency mapping of a prior NTSC TV tuner and FIG. 4 is a diagram showing a frequency mapping of a prior DTV involving a tracking filter.

Automatic selection function of the NTSC tuner, as described FIG. 3, selects a corresponding frequency band of the routes divided in 2 bands or 3 bands respectively by a band switching operation of a tracking filter, a mixer and a voltage control oscillator and a frequency tuning voltage.

That is, the frequency tuning voltages of the tracking filter, mixer and voltage control oscillator to the each band form one route and operate according to the frequency control voltage of about 0–30V. Thus, the tuner can automatically select frequency by one-to-one mapping between frequency operations according to the tuning voltage of a voltage control oscillator and a tracking filter.

However, the front end of the DTV tuner comprising a tracking filter, as described FIG. 4, selects a frequency of the tracking filter corresponding to only one among the 3bands or 2bands according to the tuning voltage by a switching operation. Namely, unlike the NTSC tuner, since one voltage control oscillator in the DTV tuner comprises all of broadcasting frequency bands (BW=760 MHz) for the frequency tuning voltage by phase synchronization loop, the frequency mapping between a tracking filter and voltage control oscillator for a frequency tuning voltage cannot be performed. At results, the prior tuner cannot perform an automatic selection of frequency.

SUMMARY OF THE INVENTION

The object of the present invention is to provide an apparatus, method and readable medium capable of automatically selecting a broadband frequency channel using approximated frequency mapping function.

The another object of the present invention is to provide an apparatus, method and readable medium capable of automatically selecting a broadband frequency channel by calibrating a frequency in even of change of the characteristics of tuning frequency.

In accordance with the object of the present invention, there is provided an apparatus for automatic selection of a broadband frequency channel using double frequency conversion comprising: a frequency band dividing part for dividing a desired receiving frequency into a classified band according to a tuning voltage; a frequency converting part for performing double frequency conversion converting the divided frequency into an intermediate frequency of a desired band; a first controlling part for controlling the double frequency conversion of the frequency converting part; and a second controlling part for selecting a coefficient of an approximated frequency mapping function for a channel corresponding to a channel conversion selection signal from outside from previously stored coefficients of approximated frequency mapping function for the divided frequency.

Also, in accordance with another object of the present invention, there is provided a method for automatic selection of a broadband frequency channel using double frequency conversion comprising the steps of: a first step for finding and storing a coefficient of approximated frequency mapping function for a divided frequency by using the divided frequency characteristic and the approximated frequency mapping function, wherein the divided frequency is divided according to a tuning voltage; a second step for receiving a channel conversion signal from outside and for selecting a coefficient of approximated frequency mapping function for the channel from the stored coefficients of approximated frequency mapping function for the divided frequency; and a third step for finding a tuning voltage by using the coefficient selected at the second step and for converting a channel according to the tuning voltage.

Also, in accordance with another object of the present invention, there is provided a medium read by a computer, in which is recorded with a program for implementing functions in an apparatus for automatic selection of broadband frequency channel including a processor, the functions comprising: a first function for finding and storing a coefficient of approximated frequency mapping function for a divided frequency by using the divided frequency characteristic and the approximated frequency mapping function, wherein the divided frequency is divided according to a tuning voltage; a second function for receiving a channel conversion signal from outside and for selecting a coefficient of approximated frequency mapping function for the channel from the stored coefficients of approximated frequency mapping function for the divided frequency; and a third function for finding a tuning voltage by using the selected coefficient and for converting a channel according to the tuning voltage.

BRIEF DESCRIPTION OF THE DRAWING

The object, features and advantages of the present invention are understood within the context of the description of the preferred embodiment as set forth below. The description of the preferred embodiment is understood within the context of accompanying drawing. Which form a material part of this disclosure, wherein.

DESCRIPTION OF THE PREFERRED EMBODIMENT

The present invention is characterized in that an automatic selection of DTV Tuner and a frequency calibration are soft-wise performed by using a coefficient of approximated frequency mapping function, a tracking voltage and an addition of hardware to a DTV tuner. The added hardware is comprised of a micro-controller, an EEPROM (Electrically Erasable Programmable Read Only Memory), a digital/analog converter (D/A), an OP amp, and a switching driver. The frequency calibration is performed to correct a frequency error due to an environment and is performed software-wise.

Accordingly, the DTV tuner employing the present invention may not only suppress interference signals invoking the falling of quality of TV channel to be watched or impossibility of TV broadcasting but also operate irrelevant to an image signal and IF beat by an automatic selection of a desired TV channel. Also, the DTV tuner may calibrate a frequency in case of change of the frequency characteristic due to an operational environment.

Also, as various characteristics (for example, intermodulation, crossmodulation, linearity) invoked by out-of-band interference signal of a broadcasting channel to be watched can be suppressed by use of a tracking filter at the front end of a receiver according to the invention, an operation region of the receiver is broader. Also, the operation of the invention is not affected by an image signal and IF Beat due to use of double frequency conversion.

Further, the invention can automatically select frequency of a DTV channel and perform the calibration of a frequency although the frequency characteristic of the Tuner changing according to operation environments such as temperate. Consequently, the invention can improve a performance of the receiver for broadcasting digital terrestrial as well as is effective in real environment because of calibration of a frequency.

The description of the preferred embodiment as set forth below.

Figure 5:
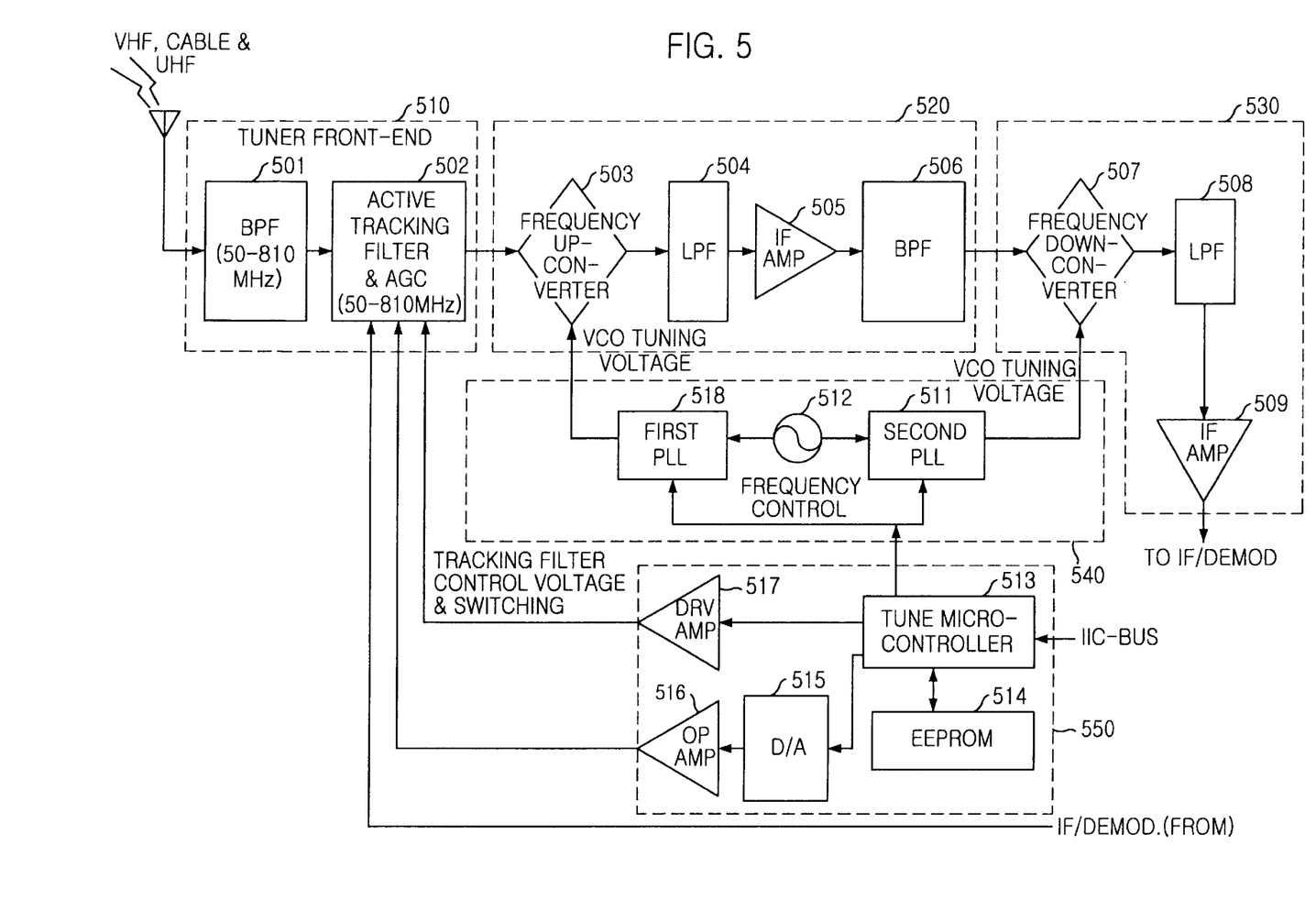
FIG. 5 is a block diagram of DTV tuner for automatically selecting broadband frequency channel using approximated frequency mapping function according to the present invention.

FIG. 5 is a block diagram of a DTV tuner for automatically selecting a broadband frequency channel using approximated frequency mapping function according to the present invention.

As described FIG. 5, the DTV Tuner according to a preferable embodiment of the present invention comprises a frequency band dividing part 510, a frequency up-controlling part 520, a frequency down-controlling part 530, a double frequency controlling part 540, and a tuner controlling part 550. The tuner controlling part 550 comprises a micro-controller 513, an EEPROM 514, a digital/analog converter (D/A) 515, an operation amplifier (OP AMP) 516, a driver-amplifier (DRV AMP) 517.

The DTV tuner according to the present invention performs the following functions:

a first function is conversion of a receiving input frequency (50–810 MHz) into a final intermediate frequency (44 MHz); a second function is active tracking filtering for band division and selection of broadband input frequency and for low noise amplification; a third function is correction (in fabrication) of a frequency due to element characteristic error a tracking filter; a forth function is calibration (in operation) of frequency change according to an environmental characteristic of tracking filter in operation; a fifth function is tuning of channel frequency; and a sixth function is controlling of receiving gain by AGC manufacturing signal, removing of an image signal and filtering of out-of-channel band signals.

The frequency conversion of the DTV tuner as set forth below. First, the DTV tuner converts a tuner input frequency band (50–810 MHz) into a up-frequency (920 MHz or more) by high-side injection (frequency up-conversion), then finally converts the converted up-frequency into a down-frequency (44 MHz) by low-side injection (frequency down-conversion).

We will describe the parts of the DTV tuner according to FIG. 5 particularly.

The frequency band dividing part 510 at the front end of a tuner comprises a input band pass filter (BPF) 501 and an active tracking filter & automatic gain controller (hereafter it is called as AGC) 502.

The input band pass filter 501 passes both broadcasting channels (CH2–CH69) having a broadcasting frequency band of 50–810 MHz inputted from a receiving antenna and 181 channels having cable TV channels passed and removes non-television signal flowing in an image signal band (920 MHz or more).

Figure 6:
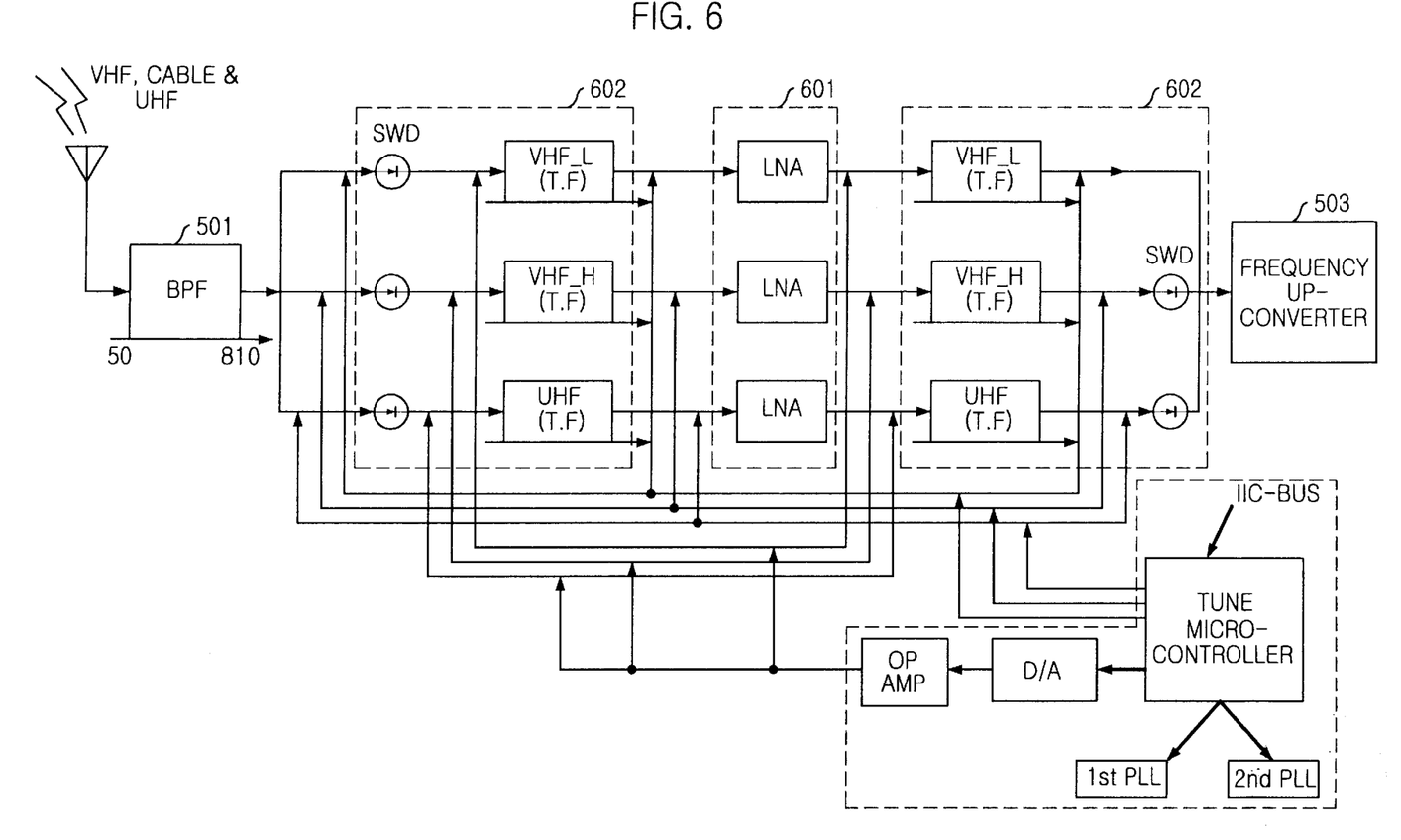
FIG. 6 is a block diagram of a frequency band dividing part at the front end of the tuner using a tracking filter according to the present invention.

The active tracking filter and AGC 502 comprises a low noise amplifier 601 for active gain control by low noise amplifying and tracking filters 602 for switching at the input/output end of the low noise amplifier 601.

The tracking filter 602 is a kind of LC resonance tank circuit consisted of a pair of inductor and varactor diode and is associated with the low noise amplifier 601 to provide gain to a desired TV channel. Also, suppressing mutual modulation components invoked by a large undesired TV channel, FM channels, interference signals of out-of-band, the tracking filter 602 decrease the input voltage loan of the low noise amplifier and mixer and results in broadness of operation region of receiver. Since the varactor diode of the tracking filter 602 is limited to capacitance of capacitor according to tuning voltage, its operation frequency is divided into 3bands (VHF_L, VHF_H & UHF) or 2bands (VHF & UHF) as described FIG. 6 depicting the frequency band dividing part.

Also, providing active gain controlling range of about 35–40 dB by using a dual-gate MOSFET, the active tracking filter & AGC 502 prevents other active elements from overloading due to a large input signal and to maintain an optimum state of demodulator.

The frequency up-controlling part 520 comprises a frequency up-converter 503, a low pass filter(LPF) 504, an IF amplifier(IF AMP) 505 and a band pass filter(BPF) 506. The low pass filter 504, the IF amplifier 505 and the band pass filter configure a first intermediate frequency part.

The frequency up-converter 503 using Monolithic Microwave Integrated Circuit (hereafter it is called as MMIC) comprises a low noise amplifier for controlling gain, a mixer and a voltage controller oscillator (VCO) and converts an input radio frequency(RF) signal into an intermediate frequency(IF) of 944 MHz (first frequency up-conversion). And the Mixer has a double-balanced configuration of high-linearity and suppresses generation of even degree harmonic component. Also the embedded voltage control oscillator has an operation frequency range of 1001–1747 MHz and selects a channel by a prescribed phase noise.

The low pass filter 504 reduces an input power load of the IF amplifier 505 by suppressing the spurious component due to the operation of the mixer. The band pass filter 506 filters signals of out-of-desired band and the IF amplifier 505 compensates for an insertion loss due to two filters by high IP3(3rd-order intercept point).

The frequency down-controlling part 530 comprises a frequency down-converter 507, a low pass filter(LPF) 508 and an IF amplifier(IF AMP) 509, and the functions of the components are as follows.

Using the MMIC chip consisted of a low pass amplifier, a mixer and a voltage control oscillator, the frequency down-converter 507 converts an input IF signal of 944 MHz into a final IF of 44 MHz. The mixer has high linearity and double-balanced configuration. The operation frequency of embedded voltage control oscillator operates with a phase noise prescribed at the fixed state of 900 MHz.

The low pass filter 508 and the IF amplifier 509 at the end of tuner are suppress the spurious component due to the mixer of the frequency down-converter then amplifies the signal.

Since a DTV tuner uses double frequency conversion, the double frequency controlling part 540 is configured to comprise a first and a second phase locked loop(PLL) 518 and 519 and a crystal oscillator of 4 MHz 512 as a common source to control frequency conversions of the frequency up-converter 503 and the frequency down-converter 507.

When a common tuner use the tracking filter for improving a performance of a receiver, one-to-one mapping between a tracking filter and voltage control oscillator to a frequency tuning voltage is not performed and an automatic selection of frequency channel cannot be performed by an AGC and IIC-Bus signal.

Thus, the tuner of the present invention comprises a tuner controlling part 550 configured of a tune micro-controller 513, an EPPROM 514, a digital/analogue converter (DIA) 515, an operation amplifier (OP AMP) 516 and a driver amplifier (DRV AMP).

The tune micro-controller 513 interfaces with the information about a frequency channel selection flowed by a IIC-BUS from outside. And the tuner micro-controller 513 previously calculates a coefficient of approximated frequency mapping function for the divided frequency and provides it to the EEPROM 514.

That is, when the IIC-BUS signal having the frequency information is applied to the tun micro-controller 513, it decodes the IIC-BUS signal to find a frequency of the signal then provides an information of the frequency corresponding to the IIC-BUS signal to the first PLL 510. At the same time, the tune micro-controller 513 read out a coefficient of approximated frequency mapping function for the frequency of the signal among coefficients of approximated frequency mapping function previously stored in the EEPROM 514 and calculates the frequency value and transmit it to the D/A 515. Then, the D/A 515 outputs an analogue value corresponding to the inputted value to the OP AMP 516. And the OP AMP 516 converts the analogue value into a DC value and provides it to the tracking filter and AGC 502 as a tuning voltage.

Figure 8:
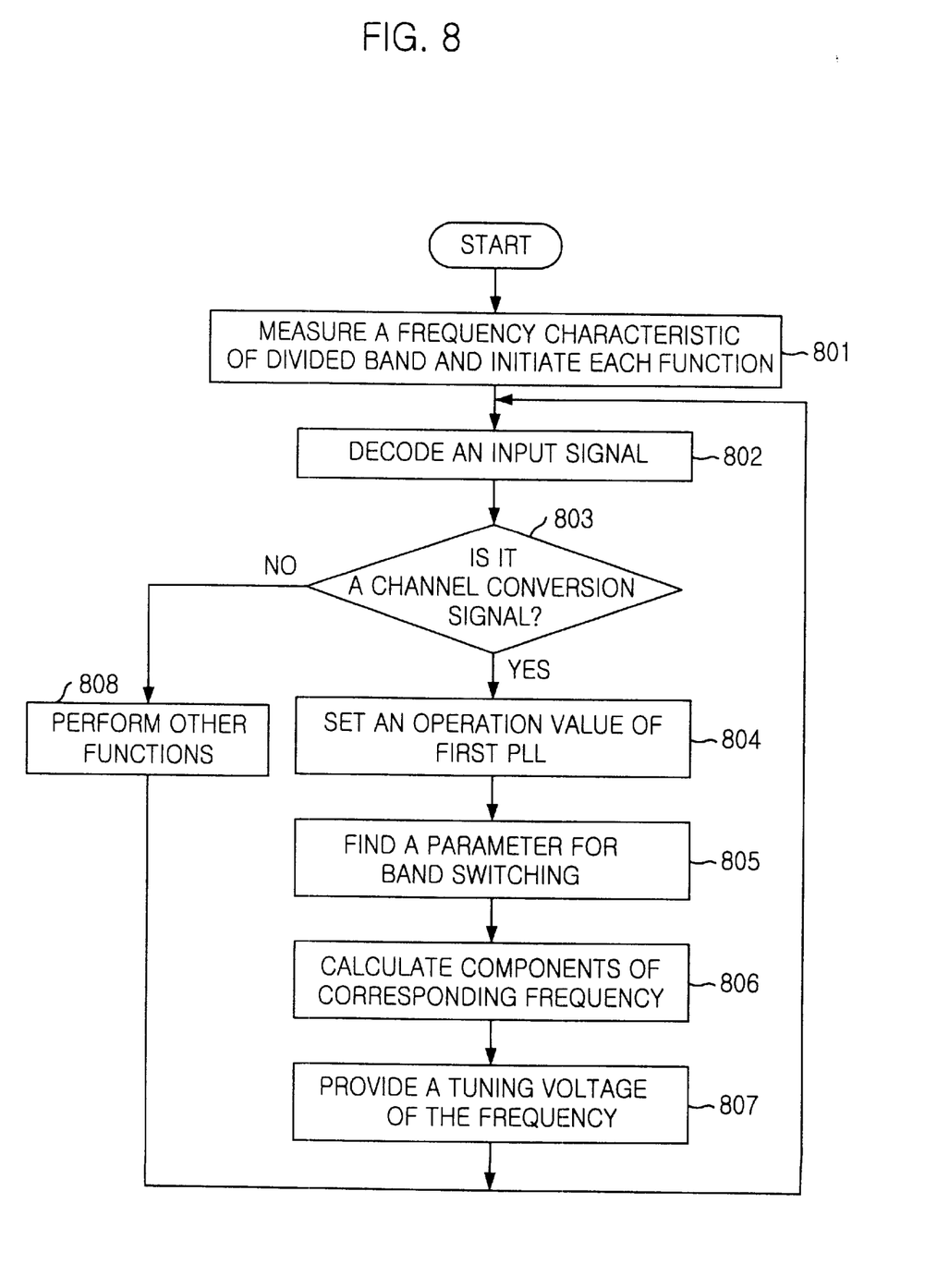
FIG. 8 is a flow chart of the method for automatically selecting broadband frequency channel in the tuner controller according to the present invention.

FIG. 8 is a flow chart of the method for automatically selecting a broadband frequency channel in the tuner controlling part 550 according to the present invention.

First, After measuring each frequency of 3bands divided by the tuning voltage of the tracking filter 602 at the front of the tuner, coefficients (A0–A5) of approximated functions for the 3bands are calculated by the measured data and an approximated frequency mapping function (represented by the following expression 1) then are stores in the EEPROM 514. After that, the functions of the tuning controlling part 550 are initialized.

Then, when the IIC-BUS signal comprising the frequency information (PLL data and clock signal) from an outside main micro-controller is applied to the micro-controller 513 of the tuning controlling part 550, the micro-controller 513 decodes the IIC-BUS signal to determine the frequency of the signal (802).

If the input signal is a channel conversion signal (803), the micro-controller 513 sets an operation value of the first PLL using the information of the frequency corresponding to the signal (804) and finds a parameter for band switching (805). Otherwise, the micro-controller 503 performs the other functions.

Then the frequency corresponding to the signal is calculated using F(X) function represented by expression 1 (806).

The calculated value of the F(X) is provided to the D/A 515 and is converted into an analogue value. Then, the analogue value is converted into a DC value via the OP AMP 516, at the same time, and frequency bands(VHF_L, VHF_H &UHF) corresponding to the value are selected via the DRV AMP 517. Then they are provided to the tracking filter 602 at the front end of tuner as a tuning voltage.

Further, as the frequency error due to environmental changes such as temperature may be calibrated by software-wise calculating a new coefficient of approximated frequency mapping function using a value of a changed tracking filter, the frequency mapping becomes simple.

In the invention, approximated frequency mapping functions in real uses an approximated method of 5 degree polynomial and voltages for 181 TV channel frequency is calculated by use of the expression 1:

$$F(X) = A0 + A1X + A2X^2 + A3X^3 + A4X^4 + A5X^5$$

Where the X indicates a central frequency (TV channel), and A1, A2, A3, A4, A5 indicate coefficients of an approximated function.

Figure 7A:
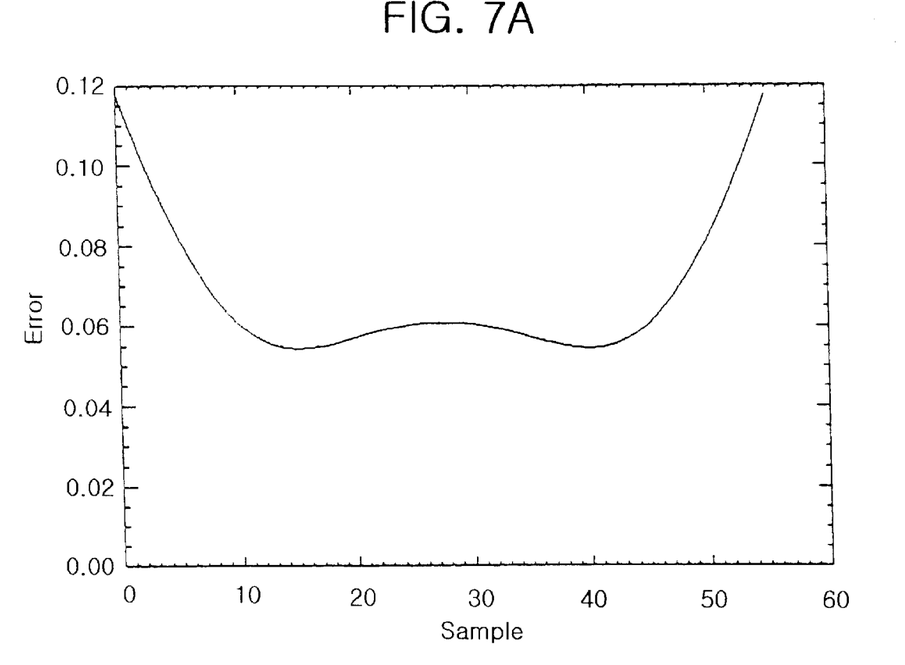
FIG. 7A–7C are diagrams showing frequency mappings of a DTV tuner for automatically selecting broadband frequency channel using approximated frequency mapping function according to the present invention.
Figure 7B:
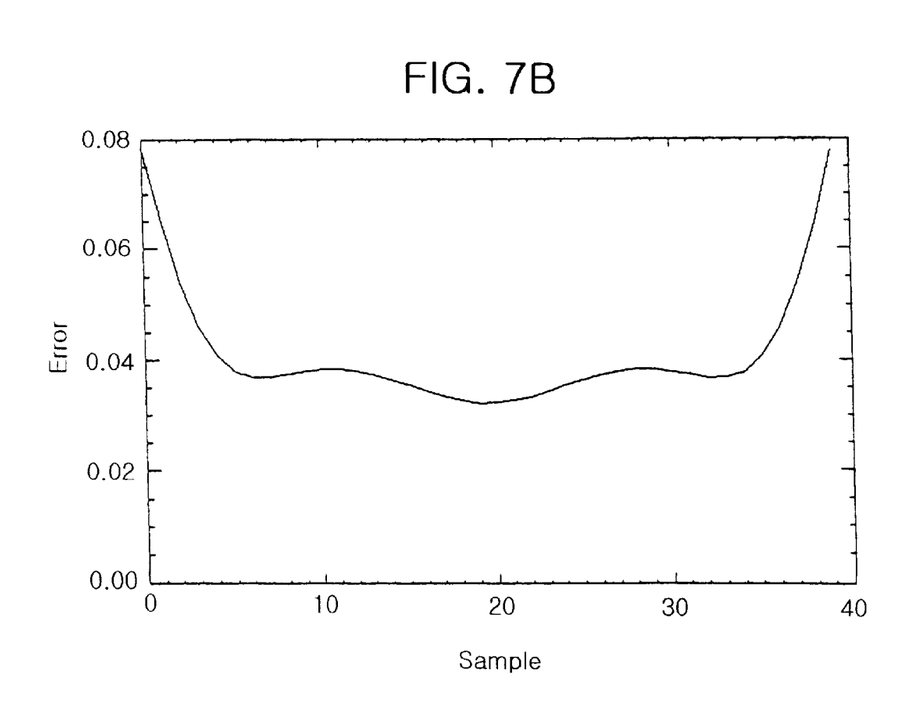
Figure 7C:
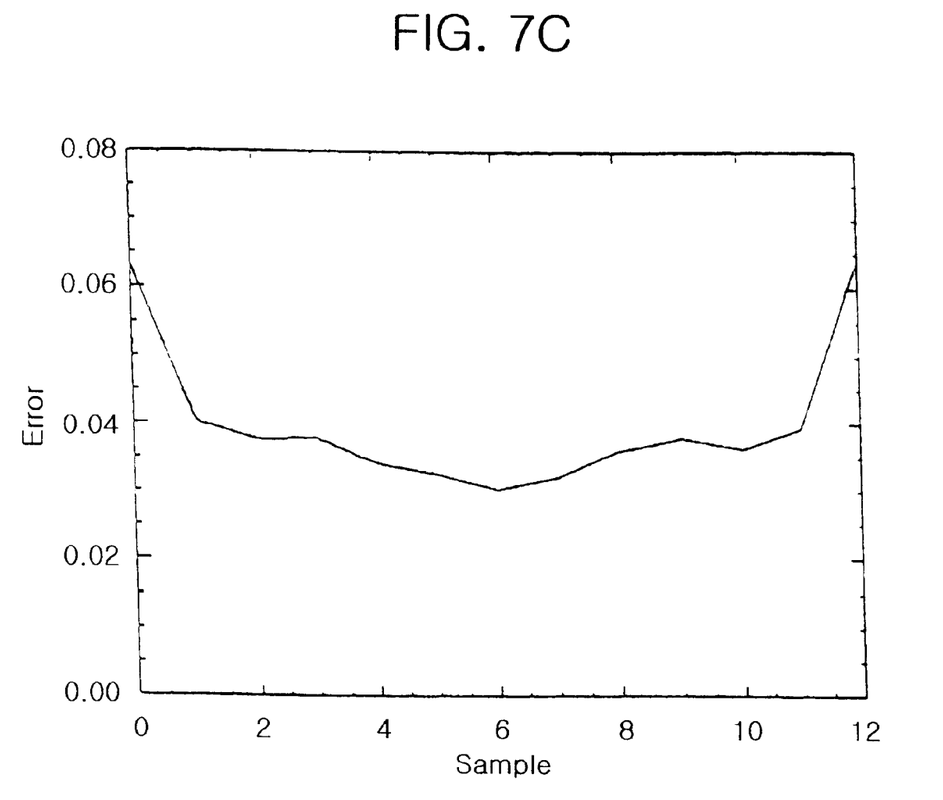

Results of simulation for UHF standard TV channel, VHF high and VHF low TV channel corresponding to the voltage value of tracking filter measured in real and the coefficients of approximated frequency mapping function of the expression 1 are shown FIG. 7A–7C. In the Figs, X axis is the number of TV channel and Y axis is an error (V) between a measurement value and approximated function.

Consequently, according to the present invention, adding a simple hardware and software to a DTV tuner, a frequency error according to the environmental change can be calibrated and an automatic selection of a channel frequency can be performed. Thus, the performance of the DTV tuner can be improved.

Also, as the present invention can suppress various characteristics (for example, intermodulation, crossmodulation, linearity)invoked by out-of-band interference signal of a broadcasting channel being watched, an operation region of the receiver is broader.

Although a preferred embodiment of the present invention has been illustrated and described, various alternatives, modifications and equivalents may be used. Therefore, the foregoing description should not be taken as limiting the scope of the present invention, which is defined by the appended claims.

What is claimed is:

1. An apparatus for automatic selection of a broadband frequency channel using double frequency conversion comprising:
   a frequency band dividing part for dividing a desired receiving frequency. into a classified band according to a tuning voltage;
   a frequency converting part for performing double frequency conversion converting the divided frequency into an intermediate frequency of a desired band;
   a first controlling part for controlling the double frequency conversion of the frequency converting part; and
   a second controlling part for selecting a coefficient of an approximated frequency mapping function for a channel corresponding to a channel conversion selection signal from outside from previously stored coefficients of approximated frequency mapping function for the divided frequency.

2. An apparatus in accordance with claim 1, the second controlling part comprising:
   a storage for storing the coefficient of approximated frequency mapping function for the divided frequency;
   a controller for calculating the coefficient of the divided frequency by using the divided frequency characteristic and the approximated frequency mapping function and providing it to the storage, and in receiving the channel conversion selection signal from outside, for reading out the coefficient of approximated frequency mapping function corresponding to the channel frequency in the storage and simultaneously providing an information about the,channel frequency to the first controlling part; and
   a tuning voltage provider for generating a frequency tuning voltage according to the read coefficient of approximated frequency mapping function and for providing it to the frequency dividing part.

3. An apparatus in accordance with claim 1, when a frequency response characteristic of the apparatus is changed, the frequency is calibrated by changing a coefficient of approximated frequency mapping function of the frequency.

4. An apparatus in accordance with claim 3, the frequency response characteristic is changed by an outside environment of the apparatus.

5. An apparatus in accordance with claim 3, the frequency response characteristic is changed by an element characteristic error of a tracking filter in the apparatus.

6. A method for automatic selection of a broadband frequency channel using double frequency conversion comprising the steps of:
   a first step for finding and storing a coefficient of approximated frequency mapping function for a divided frequency by using the divided frequency characteristic and the approximated frequency mapping function, wherein the divided frequency is divided according to a tuning voltage;
   a second step for receiving a channel conversion signal from outside and for selecting a coefficient of approximated frequency mapping function for the channel from the stored coefficients of approximated frequency mapping function for the divided frequency; and
   a third step for finding a tuning voltage by using the coefficient selected at the second step and for converting a channel according to the tuning voltage.

7. A method in accordance with claim 6, the method further comprises a forth step of calibrating a frequency by changing a coefficient of approximated frequency mapping function of the frequency, when the frequency response characteristic is changed.

8. A method in accordance with claim 7, the frequency response characteristic is changed by an outside environment of the apparatus implementing the method.

9. A method in accordance with claim 7, the frequency response characteristic is changed by an element characteristic error of a tracking filter in the apparatus implementing the method.

10. A medium read by a computer, in which is recorded with a program for implementing functions in an apparatus for automatic selection of broadband frequency channel including a processor, the functions comprising:

a first function for finding and storing a coefficient of approximated frequency mapping function for a divided frequency by using the divided frequency characteristic and the approximated frequency mapping function, wherein the divided frequency is divided according to a tuning voltage;

a second function for receiving a channel conversion signal from outside and for selecting a coefficient of approximated frequency mapping function for the channel from the stored coefficients of approximated frequency mapping function for the divided frequency; and a third function for finding a tuning voltage by using the selected coefficient and for converting a channel according to the tuning voltage.

11. A medium in accordance with claim 10, when a frequency response characteristic of an apparatus implementing the functions is changed, the frequency is calibrated by changing a coefficient of approximated frequency mapping function of the frequency.

12. A medium in accordance with claim 11, the frequency response characteristic is changed by an outside environment of the apparatus.

13. A medium in accordance with claim 11, the frequency response characteristic is changed by an element characteristic error of a tracking filter in the apparatus.

* * * * *